United States Patent
Wagoner et al.

(10) Patent No.: US 9,748,947 B1
(45) Date of Patent: Aug. 29, 2017

(54) IGBT GATE DRIVE CIRCUIT AND METHOD

(71) Applicant: GE Energy Power Conversion Technology Limited, Rugby, Warwickshire (GB)

(72) Inventors: Robert Gregory Wagoner, Salem, VA (US); Tobias Schuetz, Munich (DE); Todd David Greenleaf, Salem, VA (US); Terry Michael Tackman, Salem, VA (US)

(73) Assignee: GE ENERGY POWER CONVERSION TECHNOLOGY LTD (GB)

( * ) Notice: Subject to any disclaimer, the term of this patent is extended or adjusted under 35 U.S.C. 154(b) by 0 days.

(21) Appl. No.: 15/207,585

(22) Filed: Jul. 12, 2016

(51) Int. Cl.
*H03K 3/00* (2006.01)
*H03K 17/567* (2006.01)

(52) U.S. Cl.
CPC .................. *H03K 17/567* (2013.01)

(58) Field of Classification Search
CPC .................................................... H03K 17/567
See application file for complete search history.

(56) References Cited

U.S. PATENT DOCUMENTS

| | | | | |
|---|---|---|---|---|
| 6,275,093 B1* | 8/2001 | Shekhawat | ........ | H03K 17/0828 327/432 |
| 6,459,324 B1* | 10/2002 | Neacsu | ........... | H03K 17/166 327/379 |
| 7,368,972 B2* | 5/2008 | Grbovic | .......... | H03K 17/0406 327/108 |
| 7,642,817 B2* | 1/2010 | Jasberg | ............. | H03K 17/082 327/108 |
| 7,679,425 B2* | 3/2010 | Miettinen | .......... | H03K 17/168 327/108 |
| 9,496,864 B2 | 11/2016 | Wagoner et al. | | |
| 2015/0162905 A1 | 6/2015 | Wagoner | | |

* cited by examiner

*Primary Examiner* — Kenneth B Wells
(74) *Attorney, Agent, or Firm* — GE Global Patent Operation; Scott R. Stanley

(57) ABSTRACT

There are provided methods and systems for operating insulated gate bipolar transistors (IGBTs). For example, there is provided a method that can include detecting a desaturation condition in an IGBT and initiating a turn off procedure when desaturation is detected. The turn off procedure can include holding a gate of the IGBT at at least one voltage level intermediate between a positive rail voltage and a negative rail voltage of an operational range of the IGBT.

18 Claims, 4 Drawing Sheets

IGBT GATE DRIVE CIRCUIT AND METHOD

I. TECHNICAL FIELD

The present disclosure relates to insulated gate bipolar transistors (IGBTs). More particularly, the present disclosure relates to IGBT gave drive circuits and methods of operation thereof.

II. BACKGROUND

IGBTs are minority carrier devices that have high input impedance and large current gain. The high input impedance is provided by a metal-oxide-semiconductor input stage and the large current gain by a bipolar output stage. IGBTs are voltage-controlled bipolar devices that exploit the advantages of both metal-oxide-semiconductor transistor (MOSFET) and bipolar junction transistor (BJT) technologies.

IGBTs are typically used in power electronics applications where switching of large voltages and currents is needed. For example, IGBTs can be used in bridge circuits of power converters or in pulse width modulators for three-phase drives. In these applications, IGBTs must be turned off quickly in order to minimize switching losses and the devices' dead time.

In the aforementioned applications and in others where IGBTs are typically used, a particular circuit branch can include two IGBTs placed across a common source, with one IGBT being on at a time. When either one of the IGBTs fails, and the other one is turned on, a short circuit is created, causing a large current to be drawn into the circuit. This large and sudden change in current depends on the inductance of the circuit branch, and it can induce a voltage large enough to prevent the IGBT that is being turned on from reaching saturation, i.e. from reaching the biasing condition where it is fully turned on. This condition is called "desaturation," and when it occurs, an IGBT must be turned off.

However, during de-saturation, turn-off is challenging, as a large collector-to-emitter voltage is developed across the IGBT, in addition to the large current being drawn. These conditions cause large voltage overshoots, which can damage the device and/or its loads.

Desaturation is typically handled by introducing a Zener diode across the IGBT's collector-to-emitter branch to block the short circuit current. However, this method reduces the DC link voltage at which the IGBT can be operated, thus preventing it from being used for relatively high power applications. As such, there is a need for gate drive technologies that provide adequate means for handling and preventing damage that can potentially occur from desaturation without limiting the devices' power delivery capacity.

III. SUMMARY

The embodiments featured herein can help solve or mitigate the above-noted deficiencies. For example, there is provided a gate drive and a method of operation thereof that can yield improved IGBT gate drive capabilities over typical IGBT gate drives. Namely, the embodiments can provide reduced switching losses, higher DC link voltage capability without causing damage to an IGBT, as well as reduced dead-time. The embodiments also reduce circuit complexity by obviating the need for Zener diode clamp circuits for protecting IGBTs during short circuit desaturation.

One embodiment provides a method for operating an IGBT. The method can include detecting a desaturation condition in the IGBT and initiating a turn off procedure when desaturation is detected. The turn off procedure can include holding a gate of the IGBT at at least one voltage level intermediate between a positive rail voltage and a negative rail voltage of an operational range of the IGBT.

Another embodiment provides a method for operating an IGBT. The method can include detecting a desaturation condition in the IGBT and initiating a turn off procedure when desaturation is detected. The turn off procedure can include holding a gate of the IGBT at a first voltage for a duration of at least a first hold time. The turn off procedure can further include setting a gate resistance of the IGBT to a first resistance while the gate is held at the first voltage and detecting whether the desaturation condition has ended. The turn off procedure can include, in response to the desaturation having ended, holding the gate at a second voltage for a duration of at least a second hold time. The turn off procedure can include setting the gate resistance to a second resistance while the gate is held at the second voltage and holding the gate at a third voltage to reach a steady-state off condition.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

V. DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
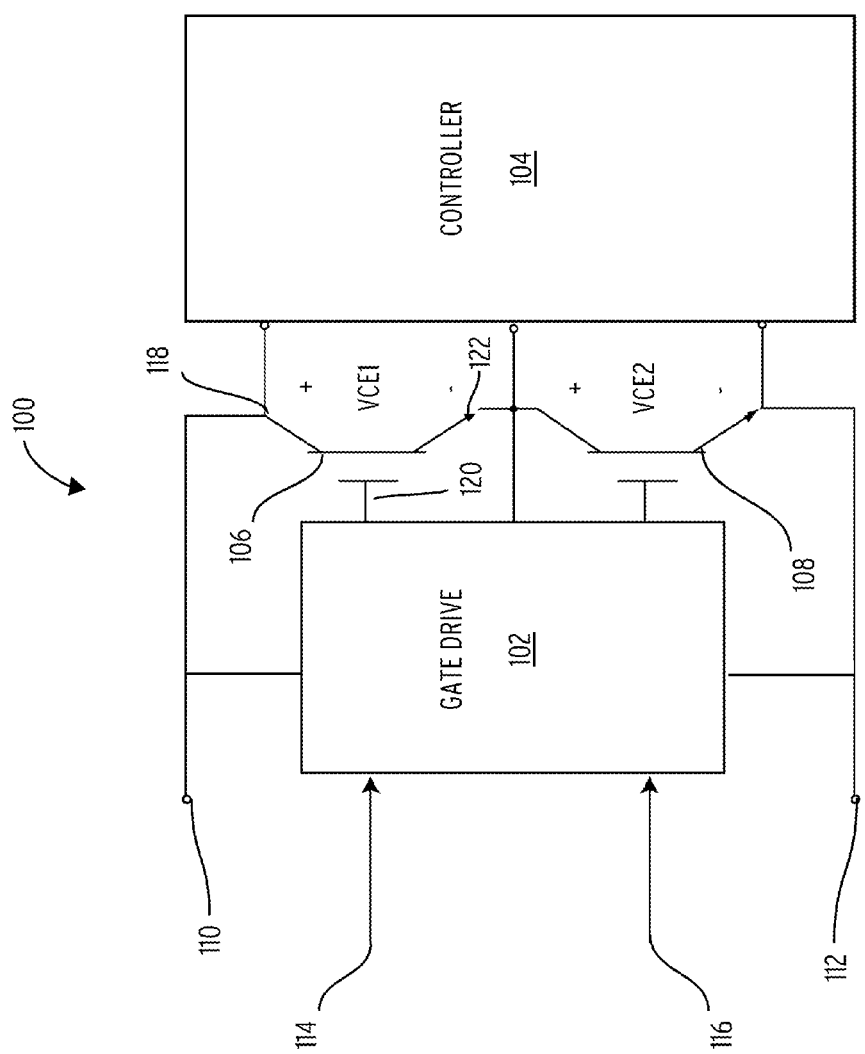
FIG. 1 illustrates a gate drive circuit for an IGBT, according to an embodiment.

FIG. 1 illustrates a circuit 100 according to an embodiment. The circuit 100 can include a gate drive circuit 102, a controller 104, and a plurality of IGBTs, of which IGBT 106 and IGBT 108 are shown. The gate drive circuit 102 can include a plurality of resistors, one of which can be selected and connected in series with the gate terminal to control the gate resistance during turn-off.

Controlling the gate resistance during turn-off, in conjunction with the Miller capacitance between the gate and the collector of an IGBT can help control the rate of change (dv/dt) of the collector-to-emitter voltage. Methods and hardware that make up the gate drive circuit 102 have been disclosed in U.S. patent application Ser. No. 14/101,579, filed on Dec. 10, 2013, issued as U.S. Pat. No. 9,444,448, and U.S. patent application Ser. No. 14/574,548, filed on Dec. 18, 2014, issued as U.S. Pat. No. 9,496,864, the contents of which are incorporated herein by reference in their entirety.

While the circuit 100 shows a specific topology, one of skill in the art will readily understand that other configurations are possible without departing from the scope of the present disclosure. Specifically, the circuit 100 is described herein to illustrate an exemplary soft turn off technique along with its associated exemplary hardware.

The IGBTs can be connected across a DC link voltage source that has a positive terminal 110 and a negative terminal 112. The DC link voltage between terminals 110 and 112 can be, for example, 1500 V. The gate of each of the IGBTs 106 and 108 can be operated in a range that extends from a positive rail voltage to a negative rail voltage. For example, the positive rail voltage can be +15V DC and the negative rail voltage can be −10 V DC.

Each of the IGBTs 106 and 108 can have a threshold voltage VTH that a voltage VGE across the gate-to-emitter junction must exceed in order for the IGBT to turn on. The threshold voltage can be, for example, +10 VDC. For example, considering the IGBT 106, the voltage across the gate 120 and the emitter 122 must exceed the threshold voltage VTH of the IGBT 106 for it to conduct a current between the collector 118 and the emitter 122 terminals.

The IGBT 106 and the IGBT 108 can either be switched on or off, with one IGBT being on while the other remains off. This switching can be controlled by the gate control signal 114 and the gate control signal 116. Furthermore, the collector-to-emitter voltage of either IGBT (i.e. VCE1 or VCE2), can be a digital pulse signal extending from the positive rail to the negative rail of the gate's operational range as a result of driving the IGBTs with the gate control signals 114 and 116.

When one of the IGBTs fails, for example, due to high temperatures, high electric fields, or overvoltage, a dielectric breakdown can create a short circuit that triggers a desaturation condition. For instance, when the IGBT 108 fails, it becomes a short circuit, and a desaturation condition in the IGBT 106 occurs when the IGBT 106 is turned on. In other words, a large VCE1 can develop across the collector 118 and the emitter 122 terminals in addition to a large and sudden change in current being present between the collector 118 and the emitter 112 terminals.

According to one embodiment, the controller 104 can be configured to detect a desaturation condition in either one of the IGBTs and instruct the gate drive circuit 102 to initiate a soft turn-off procedure to mitigate the desaturation condition. For example, with respect to the IGBT 106, the controller 104 can be configured to detect the desaturation condition by detecting whether VCE1 has exceeded a desaturation threshold, or by detecting whether the emitter to collector current has exceed a desaturation current threshold.

For example, the controller 104 can use an internal comparator to compare VCE1 with a reference desaturation threshold voltage. In some embodiments, the reference desaturation threshold can be +10.3 V DC. When VCE1 exceeds the desaturation threshold, the soft turn-off procedure can be initiated, as shall be described in greater detail with respect to the embodiments featured below.

Figure 2:
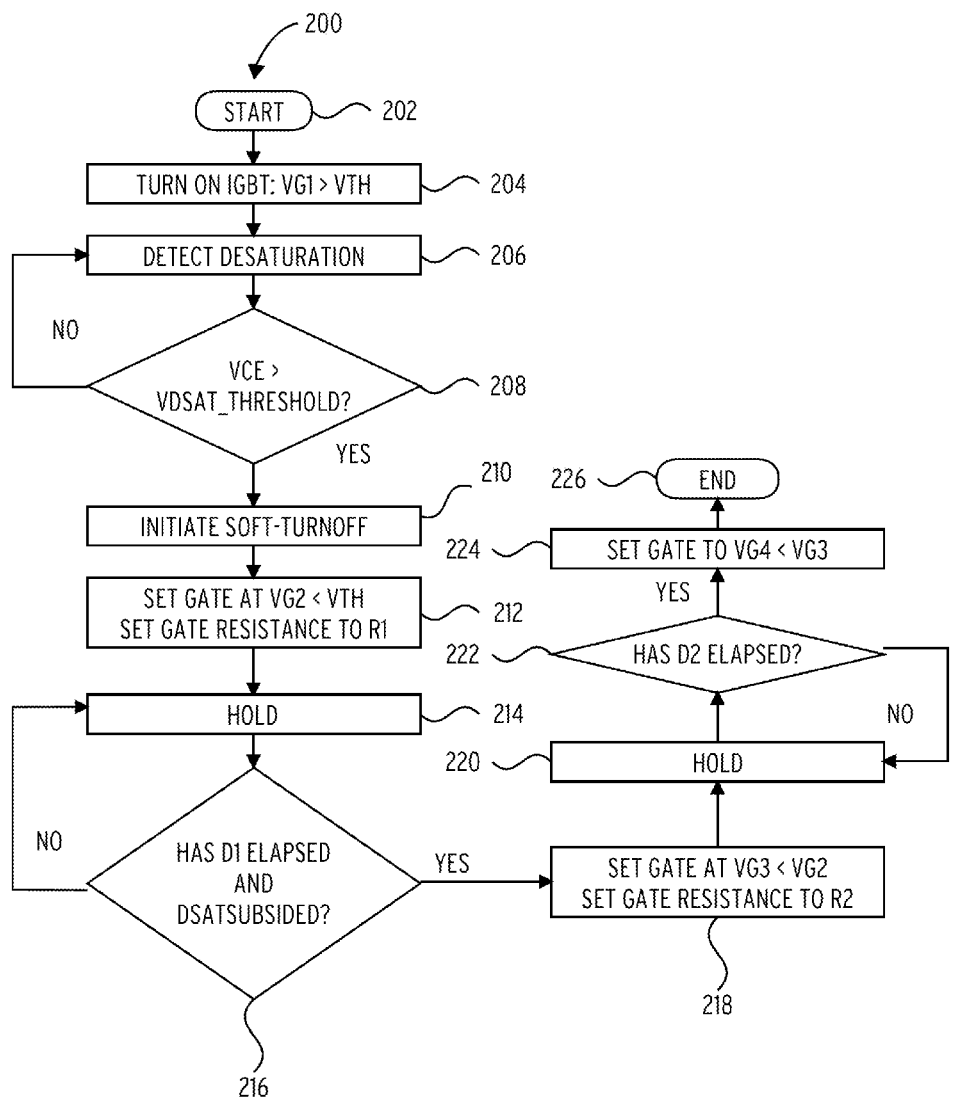
FIG. 2 illustrates a method, according to an embodiment.

FIG. 2 depicts a flow chart of a method 200, according to an embodiment. The method 200 can be programmed into the controller 104 to cause the controller 104 to perform the various operations that mitigate desaturation in an IGBT. The method 200 can begin at a block 202, and it can include turning on an IGBT at block 204. Turning on the IGBT can include setting its gate-to-emitter voltage at a voltage VG1 greater than its threshold voltage VTH.

At block 206, the method 200 can include detecting a desaturation condition. The desaturation can be a sudden rise in current between the emitter and the collector terminals, which in turn, causes a large voltage drop between those two terminals. As such, detecting the desaturation can include comparing the collector-to-emitter voltage VCE with a predetermined desaturation threshold voltage (VDSAT_THRESHOLD, as shown in decision block 208).

In other embodiments, detecting the desaturation can be performed by monitoring the current flowing from the emitter to the collector of the IGBT or monitoring a rate of change of the current, and subsequently performing a thresholding operation such as the one described above with respect to the collector-to-emitter voltage.

The controller 104 can be programmed in a free running mode such that it can continually check whether desaturation occurs. For example, at decision block 208, the controller 104 can continually check whether desaturation has occurred by returning to the block 206.

When a desaturation condition is detected, e.g. when VCE is found to be greater than the reference desaturation voltage threshold, the method 200 can proceed to block 210 at which point a soft-turn off procedure is initiated. The soft turn off procedure can include setting the gate of the IGBT at a voltage VG2 that is less than the threshold voltage VTH of the IGBT (block 212).

Furthermore, the speed of gate voltage change can be influenced by setting a resistance R1 by the gate drive circuit 102. As previously mentioned above, modulating (i.e. controlling or changing) the gate resistance can, in conjunction with the Miller capacitance from collector to gate, help limit the rate of change of the voltage across the collector-to-emitter junction. In some embodiments, R1 can be a low resistance, such as a 1 Ohm resistor.

In general however, the value of R1 can depend on the device's characteristics. For instance, from one device to another, Miller capacitances and gate charge requirements can vary, as well as the internal gate resistance of the devices, which adds to the total gate resistance. Therefore, all these factors can be taken into account in order to select a value of R1 that provides a fast switching event, i.e. a fast gate voltage change. In some embodiments, R1 may vary from about 0 Ohm to about 10 Ohm.

The method 200 can further include holding the gate of the IGBT at VG2 with a resistance of R1, for at least a time D1 (block 214). The method 200 can include continually checking whether the time D1 has elapsed at decision block 216. D1 can be, for example, about 750 nanoseconds or longer.

At decision block 216, the method 200 can also include checking whether desaturation has subsided, e.g. checking whether D1 has elapsed. When this condition is met, the method 200 can include setting the gate of the IGBT at a voltage VG3 that is less than VG2 and the gate resistance at a resistance R2 that is larger than R1 (block 218).

For example, VG3 can be +1.1V and R2 can be 330 Ohms. Moreover, the method 200 can include holding the IGBT at these conditions for a period of time equal to D2, where D2 is chosen to be longer than the intrinsic switching time of the IGBT (block 220 and decision block 222). For example, D2 can be 20 microseconds.

It is noted that modern fast switching IGBTs can switch on or off within about 1 to 3 microseconds. This fast switching leads to low switching losses during standard operation. In order to avoid high voltage overshoots during short circuit (very high current) conditions, a very slow turn off (i.e. a soft turn off) is required. This can be achieved by a large resistance R2 in combination with VG3, in addition to selecting D2 to be longer than the intrinsic IGBT switching time of about 1 to about 3 microseconds, for example.

When D2 has elapsed, the method 200 can include setting the gate voltage of the IGBT at voltage VG4 that is less than VG3 (block 224). For example, VG4 may be equal to −10V DC, or generally, it may be equal to the negative rail voltage of the operational range of the gate terminal. The method 200 can then end at block 226. Alternatively, the method 200 can proceed to either one of block 204 or block 206 instead of ending at block 226.

Figure 3:
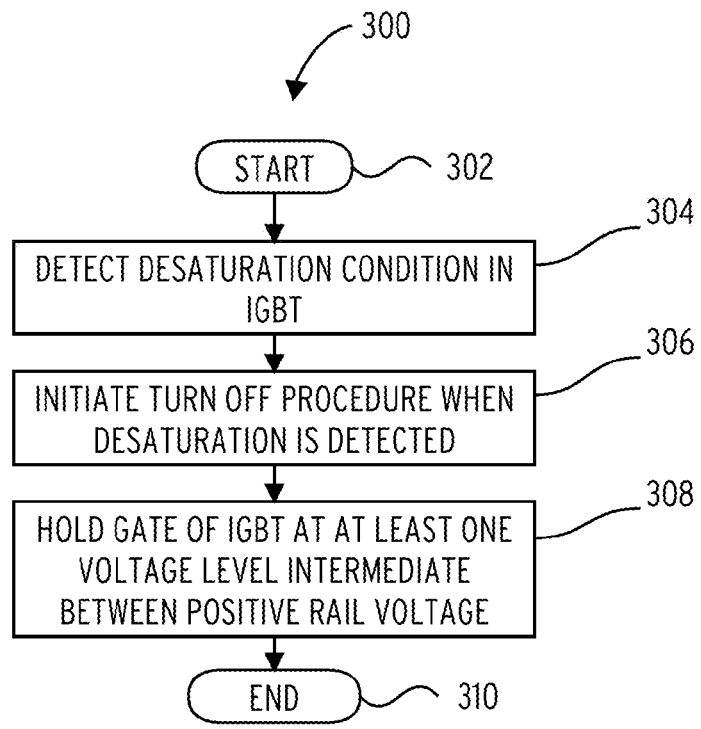
FIG. 3 illustrates a method, according to an embodiment.

FIG. 3 illustrates a method 300 for operating an IGBT in accordance with one embodiment. Generally, the method 300 can begin at block 302, and it can include detecting a desaturation condition in an IGBT (block 304). Detecting a desaturation condition can be achieved as explained above, i.e. by comparing either the current into the collector (or from the emitter) with a reference desaturation current threshold or by comparing to collector-to-emitter voltage with a reference desaturation voltage threshold. The rate of change of the collector or emitter current could also be used as a means for detecting desaturation.

Once the desaturation condition is detected, the method 300 can include initiating a soft turn off procedure (block 306). The soft turn off procedure can include holding the gate of the IGBT at at least one voltage level intermediate between a positive rail voltage and a negative rail voltage of the operational range of the gate terminal of the IGBT. Moreover, at each of the voltages at which the IGBT gate is held, the method 300 can include selecting a different gate resistance by a gate drive circuit (block 308).

Furthermore, each of these different voltage levels may be controlled by a different logic function of a controller executing the method 300, wherein the voltage levels may be held for predetermined minimum or maximum time periods or delays. The method 300 can then end at block 310.

Figure 4:
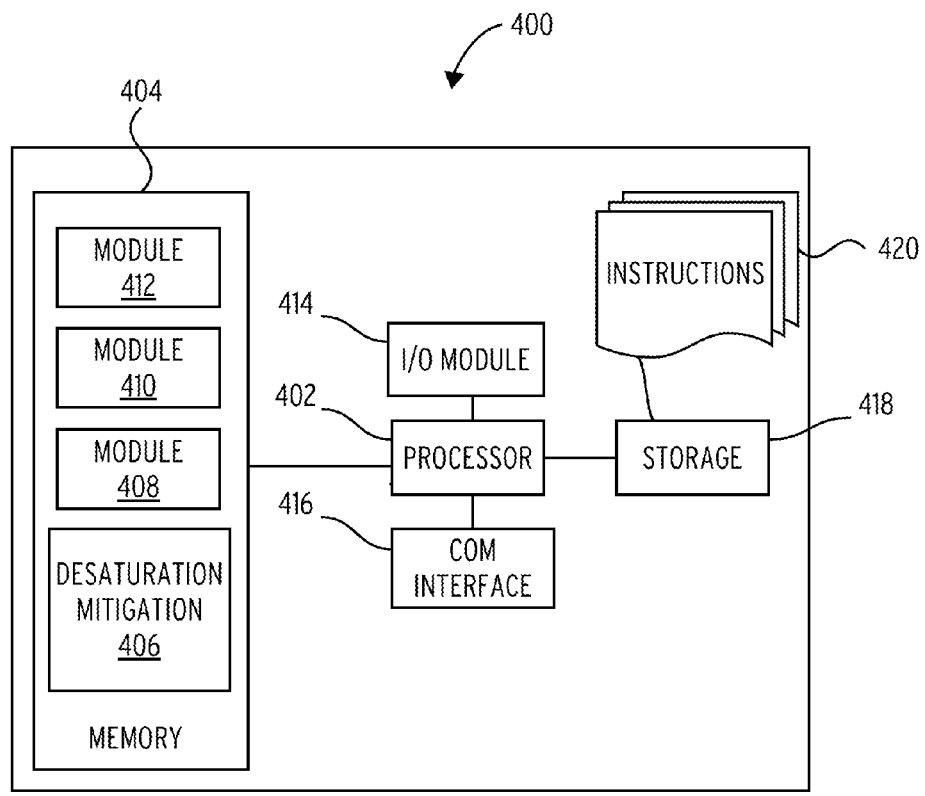
FIG. 4 illustrates a controller, according to an embodiment.

FIG. 4 shows a block diagram of a controller 400, according to an embodiment. The controller 400 can be a system like controller 104, i.e. it can be configured to operate in conjunction with one or more IGBTs.

The controller 400 can include a processor 402 that has a specific structure. The specific structure is imparted to processor 402 by instructions stored in a memory 404 included therein and/or by instructions 420 that can be fetched by the processor 402 from a storage medium 418. The storage medium 418 may be co-located with the controller 400 as shown, or it may be located elsewhere and be communicatively coupled to the controller 400.

The controller 400 can be a stand-alone programmable system, or it can be a programmable module located in a much larger system. For example, controller 400 can be part of a gate drive circuit like gate drive circuit 102 or it can be used in conjunction with a gate drive circuit like the gate drive circuit 102. Alternatively, the controller 400 can be implemented on an FPGA system.

The controller 400 may include one or more hardware and/or software components configured to fetch, decode, execute, store, analyze, distribute, evaluate, and/or categorize information. Furthermore, controller 400 can include an (input/output) I/O module 414 that can interface with one or more circuit boards or systems configured to cooperatively function with the controller 400.

The processor 402 may include one or more processing devices or cores (not shown). In some embodiments, the processor 402 may be a plurality of processors, each having either one or more cores. The processor 402 can be configured to execute instructions fetched from the memory 404, i.e. from one of memory module 412, memory module 410, memory module 408, or memory module 406, or the instructions may be fetched from storage medium 418, or from a remote device connected to controller 400 via communication interface 416.

Furthermore, without loss of generality, the storage medium 418 and/or memory 404 may include a volatile or non-volatile, magnetic, semiconductor, tape, optical, removable, non-removable, read-only, random-access, or any type of non-transitory computer-readable computer medium. The storage medium 418 and/or the memory 404 may include programs and/or other information that may be used by processor 402. Furthermore, the storage medium 418 may be configured to log data processed, recorded, or collected during the operation of the controller 400. The data may be time-stamped, location-stamped, cataloged, indexed, or organized in a variety of ways consistent with data storage practice.

In one embodiment, for example, the memory module 406 may include instructions that, when executed by the processor 402, cause processor 402 to execute a desaturation mitigation routine when the controller 400 is interfaced with one or more IGBTs. The routine may include a variety of steps and operations.

For example, the operations can include detecting a desaturation condition in an IGBT and initiating a turn off procedure when desaturation is detected. The turn off procedure can include holding a gate of the IGBT at a first voltage for a duration of at least a first hold time. The turn off procedure can further include setting a gate resistance of the IGBT to a first resistance while the gate is held at the first voltage and detecting whether the desaturation condition has ended. The turn off procedure can include, in response to the desaturation having ended, holding the gate at a second voltage for a duration of at least a second hold time. The turn off procedure can include setting the gate resistance to a second resistance while the gate is held at the second voltage and holding the gate at a third voltage to reach a steady-state off condition.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A method for operating an insulated gate bipolar transistor (IGBT), comprising:
   detecting a desaturation condition in the IGBT; and
   initiating a turn off procedure when desaturation is detected, the turn off procedure including:

holding a gate of the IGBT at at least one voltage level intermediate between a positive rail voltage and a negative rail voltage of an operational range of the IGBT; and controlling a gate resistance of the IGBT during the turn off procedure; and wherein when the at least one voltage level includes a first voltage and a second voltage less than the first voltage, the gate resistance at the first voltage is lower than the gate resistance at the second voltage.

2. The method of claim 1, further comprising controlling a time at which the gate is held at the at least one voltage level during the turn off procedure.

3. The method of claim 1, further comprising controlling a time at which the gate is held at the at least one voltage level during the turn off procedure.

4. The method of claim 2, wherein for one of the at least one voltage level the time is longer than a switching time of the IGBT.

5. The method of claim 1, wherein the at least one voltage level is smaller than a turn on threshold voltage of the IGBT.

6. The method of claim 1, further comprising setting the gate voltage at the negative rail voltage after holding the gate of the IGBT at the at least one voltage level.

7. The method of claim 1, wherein the desaturation condition is a short circuit current.

8. The method of claim 1, wherein the desaturation condition is a collector-to-emitter voltage overshoot.

9. The method of claim 1, wherein detecting the desaturation condition includes comparing a collector-to-emitter voltage to a desaturation threshold voltage.

10. A method for operating an insulated gate bipolar transistor (IGBT), comprising:
   detecting a desaturation condition in the IGBT; and
   initiating a turn off procedure when desaturation is detected, the turn off procedure including:
      holding a gate of the IGBT at a first voltage for a duration of at least a first hold time;
      setting a gate resistance of the IGBT to a first resistance while the gate is held at the first voltage;
      detecting whether the desaturation condition has ended, and in response to the desaturation having ended:
      holding the gate at a second voltage for a duration of at least a second hold time;
      setting the gate resistance to a second resistance while the gate is held at the second voltage; and
      holding the gate at a third voltage to reach a steady-state off condition.

11. The method of claim 10, wherein the first voltage is lower than a turn on threshold voltage of the IGBT.

12. The method of claim 11, wherein the first voltage is greater than the second voltage, and the second voltage is greater than the third voltage.

13. The method of claim 10, wherein the second resistance is greater than the first resistance.

14. The method of claim 10, wherein the second hold time is longer than a switching time of the IGBT.

15. The method of claim 10, wherein the third voltage is a negative rail voltage of an operational range of the IGBT.

16. The method of claim 10, wherein the first voltage and the second voltage are between a positive rail voltage and a negative rail voltage of an operational range of the IGBT.

17. A non-transitory computer-readable storage medium for use with an insulated gate bipolar transistor (IGBT), the computer-readable storage medium including instructions that when executed by a processor, cause the processor to perform operations comprising:
   detecting a desaturation condition in the IGBT; and
   initiating a turn off procedure when desaturation is detected, the turn off procedure including:
      holding a gate of the IGBT at a first voltage for a duration of at least a first hold time;
      setting a gate resistance of the IGBT to a first resistance while the gate is held at the first voltage;
      detecting whether the desaturation condition has ended, and in response to the desaturation having ended:
      holding the gate at a second voltage for a duration of at least a second hold time;
      setting the gate resistance to a second resistance while the gate is held at the second voltage; and
      holding the gate at a third voltage to reach a steady-state off condition.

18. A system for operating an insulated gate bipolar transistor (IGBT), the system comprising:
   a processor; and
   a memory storing instructions that, when executed by the processor, configure the processor to perform operations comprising:
   detecting a desaturation condition in the IGBT; and
   initiating a turn off procedure when desaturation is detected, the turn off procedure including:
      holding a gate of the IGBT at a first voltage for a duration of at least a first hold time;
      setting a gate resistance of the IGBT to a first resistance while the gate is held at the first voltage;
      detecting whether the desaturation condition has ended, and in response to the desaturation having ended:
      holding the gate at a second voltage for a duration of at least a second hold time;
      setting the gate resistance to a second resistance while the gate is held at the second voltage; and
      holding the gate at a third voltage to reach a steady-state off condition.

* * * * *